`US010297832B2`

United States Patent
Unnikrishnan et al.

(10) Patent No.: US 10,297,832 B2
(45) Date of Patent: May 21, 2019

(54) SYSTEM AND METHOD FOR MANUFACTURING A MICROPILLAR ARRAY

(71) Applicant: Nederlandse Organisatie voor toegepast-natuurwetenschappelijk onderzoek TNO, The Hague (NL)

(72) Inventors: Sandeep Unnikrishnan, The Hague (NL); Rob Jacob Hendriks, The Hague (NL)

(73) Assignee: Nederlandse Organisatie voor toegepast-natuurwetenschappelijk onderzoek TNO, The Hague (NL)

( * ) Notice: Subject to any disclaimer, the term of this patent is extended or adjusted under 35 U.S.C. 154(b) by 201 days.

(21) Appl. No.: 15/523,555

(22) PCT Filed: Nov. 19, 2015

(86) PCT No.: PCT/NL2015/050807
§ 371 (c)(1),
(2) Date: May 1, 2017

(87) PCT Pub. No.: WO2016/080831
PCT Pub. Date: May 26, 2016

(65) Prior Publication Data
US 2017/0317356 A1  Nov. 2, 2017

(30) Foreign Application Priority Data
Nov. 19, 2014  (EP) ..................................... 14193835

(51) Int. Cl.
*H01M 4/70* (2006.01)
*B81C 1/00* (2006.01)
(Continued)

(52) U.S. Cl.
CPC ........... *H01M 4/70* (2013.01); *B81C 1/00111* (2013.01); *C09D 11/52* (2013.01); *C25D 7/00* (2013.01);
(Continued)

(58) Field of Classification Search
CPC ............................ H01M 4/70; B81C 1/00111
(Continued)

(56) References Cited

U.S. PATENT DOCUMENTS

2006/0163744 A1  7/2006  Vanheusden et al.
2006/0216603 A1  9/2006  Choi
(Continued)

FOREIGN PATENT DOCUMENTS

WO        2011094642 A1    8/2011

OTHER PUBLICATIONS

Hak-Sung Kim, et al.: "Intense pulsed light sintering of copper nanoink for printed electronics", Applied Physics A; Materials Science & Processing, Springer, Berlin, DE, vol. 97, No. 4, Aug. 5, 2009, pp. 791-798, XP019758739, ISSN: 1432-0630, DOI: 10.1007/S00339-009-5360-6 figures 1, 3.
(Continued)

*Primary Examiner* — James M Erwin
(74) *Attorney, Agent, or Firm* — Banner & Witcoff, Ltd.

(57) ABSTRACT

A system and method for manufacturing a micropillar array (20). A carrier (11) is provided with a layer of metal ink (20i). A high energy light source (14) irradiates the metal ink (20i) via a mask (13) between the carrier (11) and the light source. The mask is configured to pass a cross-section illuminated image of the micropillar array onto the metal ink (20i), thereby causing a patterned sintering of the metal ink (20i) to form a first subsection layer (21) of the micropillar array (20) in the layer of metal ink (20i). A further layer of the metal ink (20i) is applied on top of the first subsection
(Continued)

layer (21) of the micropillar array (20) and irradiated via the mask (13) to form a second subsection layer (21) of the micropillar array on top. The process is repeated to achieve high aspect ratio micropillars 20*p*.

18 Claims, 6 Drawing Sheets

(51) Int. Cl.
    *C09D 11/52*     (2014.01)
    *C25D 7/00*     (2006.01)
    *G03F 7/00*     (2006.01)
    *G03F 7/004*     (2006.01)
    *G03F 7/09*     (2006.01)
    *G03F 7/095*     (2006.01)
    *H01M 4/04*     (2006.01)
    *G03F 7/20*     (2006.01)
    *G03F 7/36*     (2006.01)
    *G03F 7/40*     (2006.01)
    *H01M 4/02*     (2006.01)

(52) U.S. Cl.
    CPC .......... *G03F 7/0037* (2013.01); *G03F 7/0043* (2013.01); *G03F 7/094* (2013.01); *G03F 7/095* (2013.01); *G03F 7/2004* (2013.01); *G03F 7/36* (2013.01); *H01M 4/0452* (2013.01); *H01M 4/0471* (2013.01); *B81B 2203/0361* (2013.01); *G03F 7/40* (2013.01); *H01M 2004/025* (2013.01)

(58) Field of Classification Search
    USPC .......................................................... 429/70
    See application file for complete search history.

(56) References Cited

U.S. PATENT DOCUMENTS

| | | |
|---|---|---|
| 2007/0059584 A1 | 3/2007 | Nakano et al. |
| 2008/0111567 A1 | 5/2008 | Murata |
| 2009/0214956 A1 | 8/2009 | Prieto et al. |
| 2012/0094192 A1 | 4/2012 | Qu et al. |
| 2012/0183732 A1 | 7/2012 | Hedler et al. |
| 2014/0333916 A1 | 11/2014 | Bessonov |

OTHER PUBLICATIONS

Mar. 2, 2016—International Search Report and Written Opinion of PCT/NL2015/050807.

SYSTEM AND METHOD FOR MANUFACTURING A MICROPILLAR ARRAY

CROSS-REFERENCE TO RELATED APPLICATIONS

This application is a U.S. National Stage application under 35 U.S.C. § 371 of International Application PCT/NL2015/050807 (published as WO 2016/080831 A1), filed Nov. 19, 2015, which claims the benefit of priority to EP 1419835.7, filed Nov. 19, 2014. Benefit of the filing date of each of these prior applications is hereby claimed. Each of these prior applications is hereby incorporated by reference in its entirety.

TECHNICAL FIELD AND BACKGROUND

The present disclosure relates to a micropillar array, and a system and method for manufacturing a micropillar array.

In a world with growing demand for electrical power, 3D batteries are an emerging hot topic. Solid state thin-film batteries deposited on three dimensional (3D) micropatterned structures have the potential to combine high power density and high energy density. The specific surface area of the microstructures enable high currents to be drawn from the battery and also allows quick charging. Furthermore, the densely packed microstructures enable relatively high volumetric energy storage. Pillar structures are preferred due to the easy accessibility of their entire surface when compared to porous or perforated structures of similar aspect ratio and dimensions.

Various methods are proposed in the literature to make high-aspect nanowires or nanopillars on a substrate for battery electrode applications. See for example patent literature US2009214956 AA, WO11094642 A1, US2007059584 AA, US2006216603 AA, US2012094192 AA. The structures are either made of a metal or of doped silicon. For example, the methods may comprises deposition of the nanowire material inside a nanoporous template (e.g. electrochemically etched silicon or anodized aluminum), and the subsequent dissolution of template in order to release the nanowires. The produced nanowires may have a variety of sizes ranging from a hundred nanometer to a few microns, and various heights ranging from a few microns to hundreds of microns.

Unfortunately, techniques involving electrodeposited metal nanowires, are typically not able to produce wires with sufficient height (in the range of hundreds of microns), since the wires may tend to fall over. Furthermore, high aspect ratio structures in the nanometer scale may hold relatively less charge capacity per unit volume than micrometer scale structures. Furthermore, using a molding technique (e.g. US2012183732A1) may be impractical. Furthermore, producing micropillars by deep reactive ion etching in a silicon wafer may not be economically viable. Indeed, to improve the cost-effectivity, it is desired that the structures be processed on relatively cheap substrates (e.g. metal foils) with a cheap large-area process.

Accordingly, there remains a desire for improved systems, methods, and products providing economically-viable high-aspect ratio conductive micropillar structures, e.g. for use in 3D batteries and other applications.

SUMMARY

A first aspect of the present disclosure provides a system for manufacturing a micropillar array. The system comprises means such as a platform configured to hold a carrier. A deposition means is configured to provide a layer of metal ink onto the carrier. The deposition means may e.g. be provided with a supply suitable for holding the metal ink. The system comprises or couples a high energy light source configured to provide light capable of sintering the metal ink. A mask may be disposed between the light source and the carrier. The mask comprises a mask pattern configured to pattern the light according to a cross-section image of the micropillar array. The light source and the mask are configured to have the patterned light impinge onto the layer of metal ink thereby causing a patterned sintering of the metal ink to form a subsection layer of the micropillar array in the metal ink. A controller is arranged and programmed to control the deposition means, the light source, and the platform to manufacture the micropillar array by repeatedly providing a further layer of metal ink onto a previously formed subsection layer of the micropillar array and providing the patterned light onto the further layer of metal ink to form a further subsection layer of the micropillar array in the metal ink onto to the previously formed subsection layer.

A second aspect of the present disclosure provides a method for manufacturing a micropillar array. The method comprises providing a carrier with a layer of metal ink. A high energy light source irradiates the layer of metal ink via a mask between the carrier and the light source. The mask is configured to pass a cross-section illuminated image of the micropillar array onto the metal ink. This may cause a patterned sintering of the metal ink to form a first subsection layer of the micropillar array in the layer of metal ink. A further layer of the metal ink may be applied on top of the first subsection layer of the micropillar array and irradiated via the same mask to form a second subsection layer of the micropillar array on top.

A third aspect of the present disclosure provides a micropillar array comprising a plurality of micropillars, wherein the micropillars are formed of a periodic layered structure of sintered metal ink comprising polymerized particles in a matrix of fused metal particles. The plurality of micropillars may be disposed on a foil connecting the micropillars, wherein the foil is formed of the same sintered metal ink as the micropillars. The micropillars may be enveloped by a smooth exterior metal layer obtainable by electroplating. The micropillar array may e.g. form an electrode as part of a battery.

Metal ink typically comprises a suspension of metal nanoparticles, e.g. dissolved in a polymer matrix or dispersed in another solvent. Sintering of the metal ink by heat and/or pressure may lead to solidification, e.g. by fusing of the metal particles and/or polymerization of the matrix. By sintering the metal ink using a high energy light pattern, a conductive solid structure can be produced in a simple manner. A mask can shape the light pattern to produce micrometer scaled cross-sections of the pillars. By repeatedly adding further layers of sintered metal ink using the same pattern, the height of the micropillars can be increased to achieve a high aspect ratio. Non-sintered material between the micropillars can provide support to prevent collapse while adding further layers. The technique is not dependent on any particular substrate (e.g. silicon) and can be scaled to mass production. Accordingly, high aspect high-aspect ratio conductive micropillars can be produced in an economically-viable way.

By removing the mask after building the micropillar array and providing a further layer of sintered metal ink onto the array, the unpatterned layer can form a base section comprising a metal foil connecting the pillars. Accordingly, a cheap substrate is produced with the same material as the pillars. By etching the non-sintered parts, e.g. after completing production, an array of spatially separated pillars can be provided. By electroplating the sintered micropillars, the structure can be strengthened and the interface smoothened.

To achieve a desired function for use in a battery, the micropillars are preferably produced within a certain range of dimensions. Preferably, the micropillars have a cross-section diameter in a range between 1 and 100 micrometers. Preferably the micropillars are periodically arranged with a pitch period between 1.5 and 5 times a diameter of the pillars. Preferably, the height to diameter ratio of the pillars is in a range between 20 and 200. For example, the micropillars can be built using a plurality of subsection layers, e.g. more than thirty layers, preferably more than forty layers, or even more e.g. between fifty and two hundred layers. The thickness of the subsection layers is preferably less than 2 micrometer for proper sintering with high resolution (especially when shorter light pulses are used i.e. lower than 500 microseconds), more preferably less than 1.5 micrometer, most preferably less than 1 micrometer.

To provide suitable sintering of a micrometer scale metal ink layer, the light source should deliver sufficient power density, although not so much that unwanted heating of non-intended parts may occur. Accordingly, it is found advantageous to provide a pulse power density at the layer metal ink between 1 and 100 kilowatts per square centimeter, preferably between 3 and 30 kilowatts per square centimeter. Depending on the lateral heat flow (which affects the pattern resolution) in the layer metal ink, preferably a microsecond light flash is used having a pulse length between 30 and 10000 microseconds, preferably between 100 and 1000 microseconds. For example, a pulse energy density at the layer metal ink between 0.3 and 30 Joule per square centimeter, preferably between 1 and 5 Joule per square centimeter. To prevent photochemical processes and improved sintering by heat, the light source preferably produces a light spectrum that can be absorbed by the metal ink (depending on material and particle size). For example, for silver ink with 40 nm average particle size, optimal absorption lies in the wavelength range of 400-450 nm. The desired properties can be achieved e.g. using a high energy flash lamp. Preferably, the pattern of micropillars is sintered using a single light flash.

By making the carrier transparent, light passing the metal ink layer will not be absorbed in the carrier which absorbing may otherwise lead to heating of the carrier. By preventing heating of the carrier, it can be prevented that metal ink is sintered indirectly via the carrier instead of via the projected light pattern. Especially, lateral heating of the metal ink may happen when the carrier is heated up. For example, the carrier may have a relatively low absorption coefficient for the light from the light source, e.g. less than 0.1 per meter, less than 0.01 per meter or even less than 0.001 per meter. Alternatively, or in addition, a platform can be configured to act as a heat sink in thermal contact with the carrier for drawing heat from the carrier. For example, a thermal conductivity of the platform is more than ten times a thermal conductivity of the carrier, preferably more than twenty times, preferably more than thirty times, or even higher, e.g. between forty and hundred times. For example a glass carrier may have a thermal conductivity of 0.9 W/m/K while a steel platform can have a thermal conductivity of 36 W/m/K. A relatively low thermal conductivity of the carrier may also help prevent drawing heat from the layer of metal ink which may otherwise hinder the sintering of the ink. Also it can prevent lateral conduction of heat from sintered parts to un-sintered parts of the metal ink layer thus improving pattern resolution). Accordingly it is preferred to have a carrier with thermal conductivity less than 10 W/m/K, preferably less than 5 W/m/K, less than 2 W/m/K, or even less, e.g. between 0.1 and 1 W/m/K. The thermal conductivity of the metal ink (after coating and drying) is in the range of 0.1 and 1 W/m/K. After sintering the metal particles merge and the thermal conductivity increases, depending on the level of sintering or merging of particles and material type. For proper sintering the metal ink after coating needs to be properly dried (almost solvent-free).

Advantageously, a static mask with a fixed mask pattern can be used to produce many repeated layers of the micropillar array. By having the mask disposed directly above the layer of metal ink without optical elements therein between, losses due to optical components can be minimized. By moving the platform away relative to the mask before irradiating each subsequent layer of metal ink to a distance therein between can be fixed. To provide optimal resolution, preferably the distance between the mask and a top layer of the metal ink to be patterned is less than 0.2 millimeter, preferably less than 0.1 millimeter, e.g. between 10 and 100 micrometer, or less. By moving the platform back and forth between a deposition section and an irradiation section for each subsequent layer of the micropillar array, the mask can remain stationary at small distance from the top ink layer while further layers can be rapidly deposited on top. For example, layers can be deposited by a coating head comprising an outflow opening, to control the layer thickness.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Figure 1A:
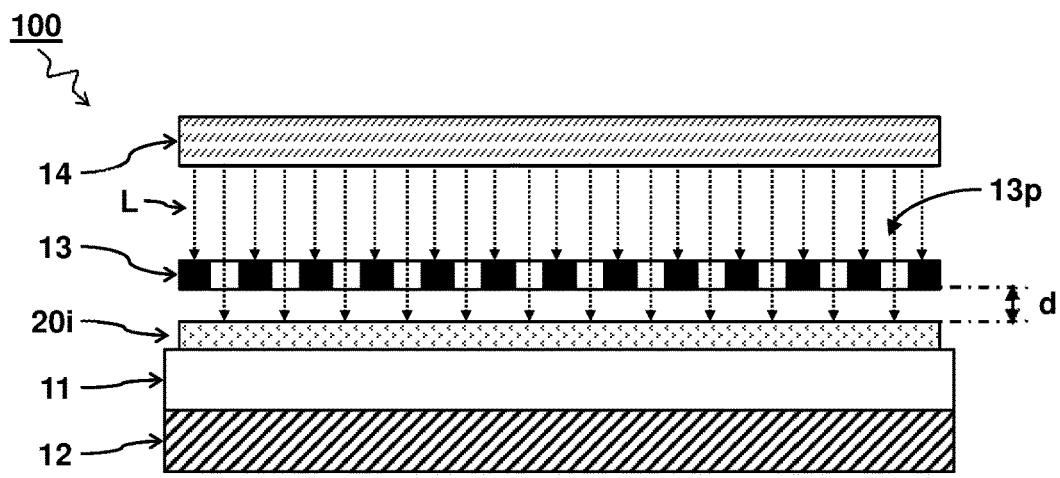
FIGS. 1A-1C schematically depict an embodiment for manufacturing a micropillar array.

Unless otherwise defined, all terms (including technical and scientific terms) used herein have the same meaning as commonly understood by one of ordinary skill in the art to which this invention belongs as read in the context of the description and drawings. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some instances, detailed descriptions of well-known devices and methods may be omitted so as not to obscure the description of the present systems and methods. Terminology used for describing particular embodiments is not intended to be limiting of the invention. As used herein, the singular forms "a", "an"

and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise. All publications, patent applications, patents, and other references mentioned herein are incorporated by reference in their entirety. In case of conflict, the present specification, including definitions, will control.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. The description of the exemplary embodiments is intended to be read in connection with the accompanying drawings, which are to be considered part of the entire written description. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

Figure 1B:
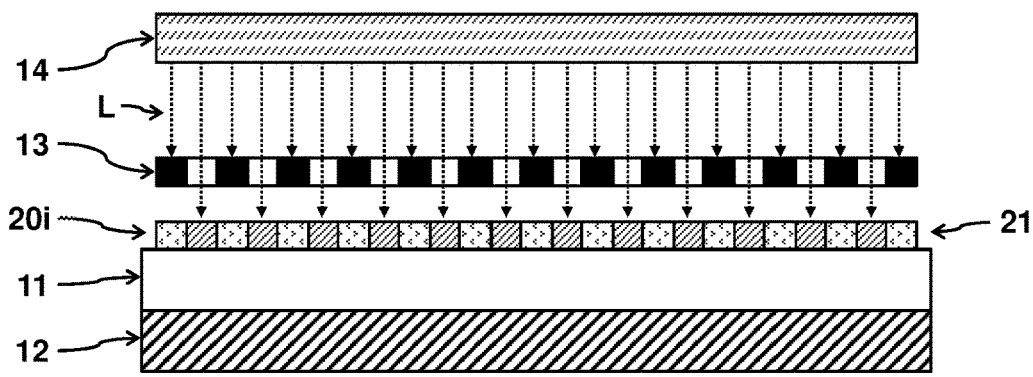
Figure 1C:
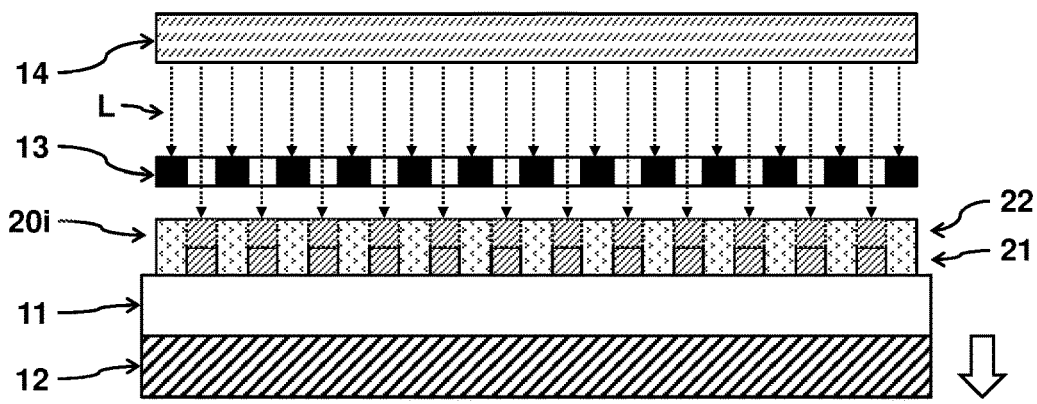

FIGS. 1A-1C schematically depict an embodiment for manufacturing a micropillar array.

As shown in FIG. 1A, a carrier 11 is provided with a layer of metal ink 20$i$. In the embodiment, the carrier is held by a separate platform 12. Alternatively, the carrier and platform can be integrated as a single piece. A high energy light source 14 is provided which is used for irradiating the layer of metal ink 20$i$. The light L of the light source 14 is patterned via a mask 13 between the carrier 11 and the light source. The mask 13 is configured to pass a cross-section illuminated image of the micropillar array onto the metal ink 20$i$. As shown in FIG. 1B, this may cause a patterned sintering of the metal ink 20$i$ to form a first subsection layer 21 of the micropillar array 20 in the layer of metal ink 20$i$. As shown in FIG. 1C, a further layer of the metal ink 20$i$ is applied on top of the first subsection layer 21 of the micropillar array 20. This further layer is again irradiated via the mask 13 to form a second subsection layer 21 of the micropillar array on top. This process may continue to increase a height of the pillars.

In one embodiment, the mask 13 is a static mask comprising a fixed mask pattern 13$p$ of a cross-section of the micropillar array 20. In one embodiment, the mask 13 is disposed above the layer of metal ink 20$i$ without optical elements therein between.

In one embodiment, the carrier 11 is transparent to the light L of the light source 14. In one embodiment, the platform 12 is configured to act as a heat sink in thermal contact with the carrier 11 for drawing heat from the carrier 11 to prevent sintering of the metal ink 20$i$ by heating of the carrier 11. In one embodiment, a thermal conductivity of the platform is more than ten times a thermal conductivity of the carrier.

Figure 2A:
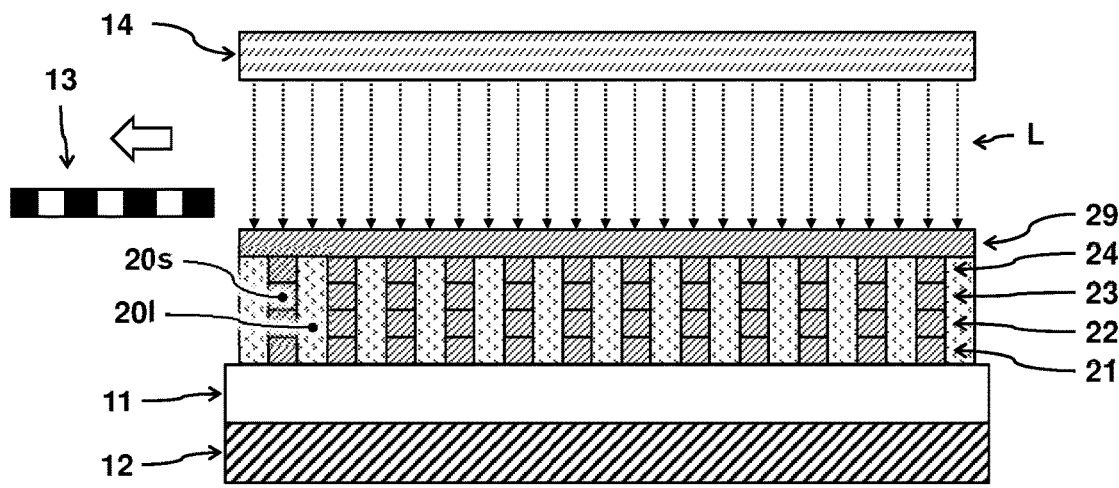
FIGS. 2A-2C schematically depict further steps of an embodiment for manufacturing a micropillar array.
Figure 2B:
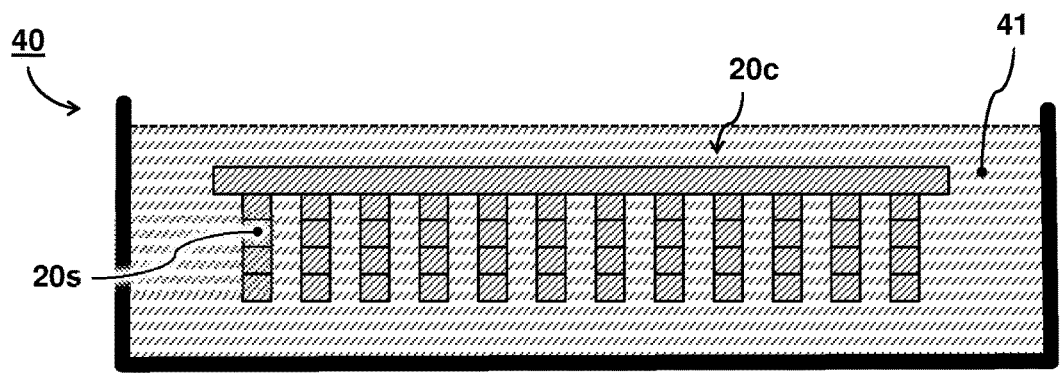
Figure 2C:
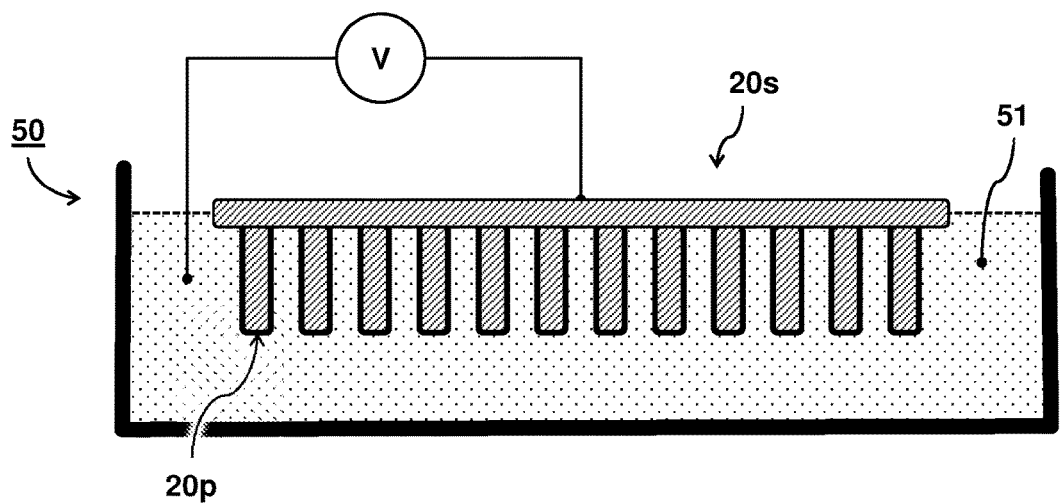

FIGS. 2A-2C schematically depict further steps of embodiments for manufacturing a micropillar array.

In one embodiment, as shown in FIG. 2A, the method comprises removing the mask 13 between the light source 14 and the carrier 11 after building a plurality of subsection layers 21,22,23,24 of the micropillar array 20. In the embodiment, a further layer of metal ink 20$i$ is provided onto a last formed subsection layer 24 of the plurality of subsection layers 21,22,23,24. Furthermore, unpatterned light L (without the mask 13) is radiated onto the further layer of metal ink 20$i$ to form a continuous base section 29 of the micropillar array 20 in the metal ink 20$i$ onto the last formed subsection layer 24. Accordingly, the base section 29 may form a metal foil connecting the pillars 20$p$ of the array 20.

In one embodiment (not shown), the method starts with a blanket or unpatterned light sintering of one or more metal ink layers directly on the carrier and then proceeds with patterned sintering of the pillars. In that case, there need not be any unpatterned light sintering done as the last step. Optionally, the carrier may comprise an adhesion/release layer before applying the first layer of metal ink. In another embodiment, optionally the sintered structure can be permanently attached to the carrier. In this way, finally after etching, the pillars will be standing upright on the carrier and the carrier will be an integral part of the final structure. In this case, there is no need for a release layer, but an adhesion layer can still be useful.

In one embodiment, the carrier 11 comprises a sacrificial layer (not shown), wherein a first layer of metal ink 20$i$ is deposited onto the sacrificial layer of the carrier 11, wherein the micropillar array 20 from the carrier 11 is released after manufacturing by disintegrating the sacrificial layer. For example, a sacrificial adhesion/release layer (curable with the flash light) between the first metal ink layer and the glass plate of the carrier. Such an adhesion/release layer can enable in the easy release of the final pillared structure after complete processing. For example, the adhesion/release layer needed not be patterned, can be coated all over and cured.

In one embodiment, as shown in FIG. 2B, the method comprises etching the non-sintered parts 20$l$ of the metal ink 20$i$ to provide an array of spatially separated pillars 20$p$ with spacing therein between. While the embodiment is shown in combination with the foil 29 obtained by the process of FIG. 2A, the etching can also be applied e.g. when the pillars are still connected to the carrier 11.

In one embodiment, as shown in FIG. 2B, the method comprises electroplating the micropillar array 20. While the embodiment is shown in combination with the foil 29 obtained by the process of FIG. 2A, the electroplating can also be applied e.g. when the pillars are still connected to the carrier 11.

According to one aspect, the methods and system described herein are used for building a battery. For example, one method comprises building a micropillar array 20 as described herein and integrating the micropillar array 20 as part of an electrode in the battery. Accordingly, a battery with an integrated micropillar structure as described herein is obtained, e.g. as part of one or more of the electrodes.

Figure 3A:
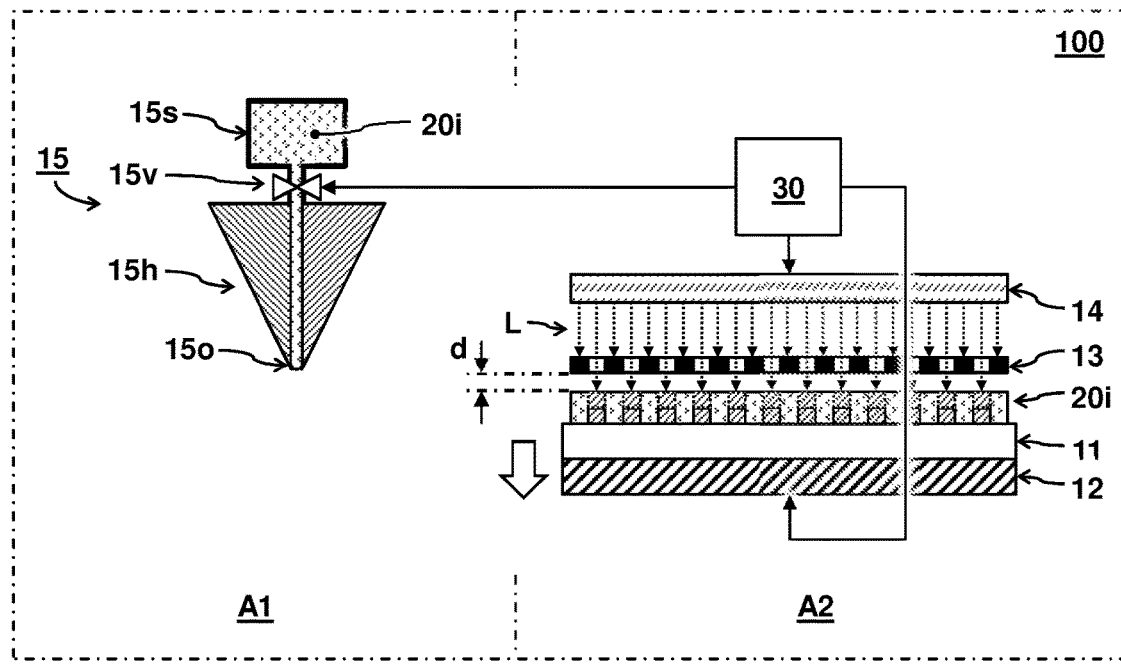
FIGS. 3A-3B schematically depict a system for manufacturing a micropillar array.
Figure 3B:
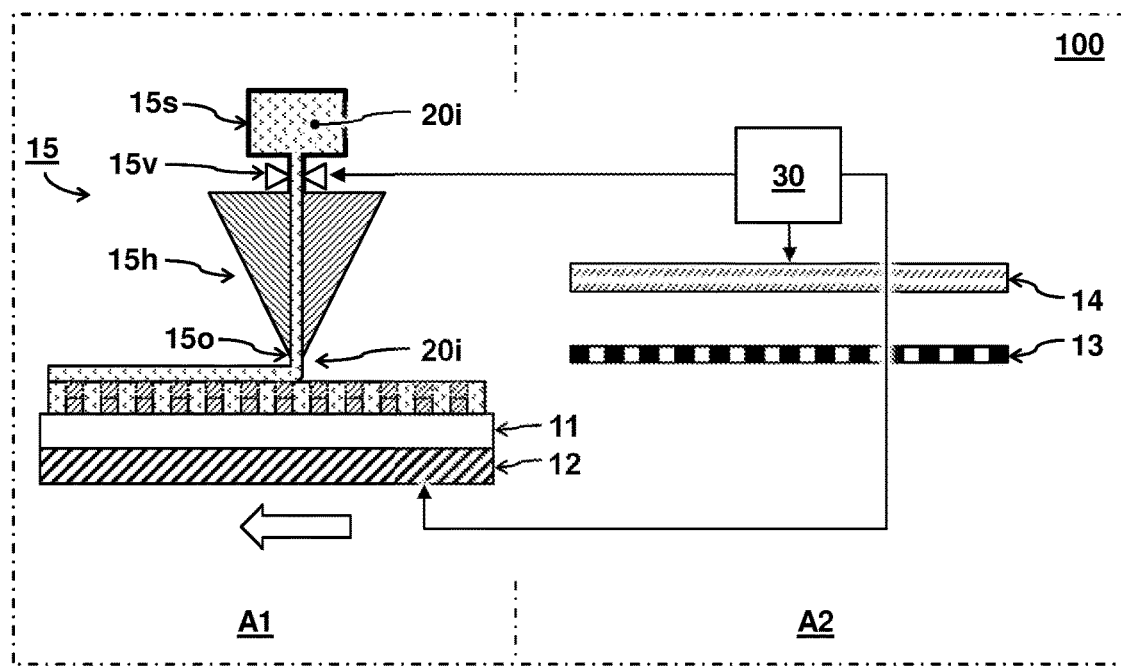

FIGS. 3A-3B schematically depict a system 100 for manufacturing a micropillar array 20, e.g. implementing the methods as described herein.

The system 100 according to the embodiment comprises a platform 12 configured to hold a carrier 11. The system further comprises a deposition means 15 comprising a supply 15s of metal ink 20i. The deposition means 15 is configured to provide a layer of the metal ink 20i onto the carrier 11. The system 100 comprises a light source 14 configured to provide light L capable of sintering the metal ink 20i. The system comprises a mask 13 between the light source 14 and the carrier 11. The mask 13 comprises a mask pattern configured to pattern the light L according to a cross-section image of the micropillar array 20. The light source 14 and the mask 13 are configured to have the patterned light impinge onto the layer of metal ink 20i thereby causing a patterned sintering of the metal ink 20i to form a subsection layer of the micropillar array 20 in the metal ink 20i. The system comprises a controller 30 arranged and programmed to control the deposition means 15, the light source 14, and the platform 12 to manufacture the micropillar array 20.

In one embodiment, the controller is configured to control parts of the system under the influence of program instructions. The program instructions can for example be embodied on a computer-readable storage medium. The program instructions may be comprised in software or hardware, e.g. programmable or dedicated circuitry. Typically, the storage medium is operatively linked to the controller. For example, the storage medium can be a memory or other storage medium, e.g. hard disk accessible to the controller. The storage medium can partly or fully integrated as part of the controller, e.g. RAM or ROM. The storage medium can also be separate from the controller.

In one embodiment, the program instructions, when executed by the controller, cause the controller to control parts of the system such as the deposition means, and possibly the platform, to provide a further layer of metal ink 20i onto a previously formed subsection layer 21 of the micropillar array 20. In a further embodiment, the program instructions, when executed by the controller, cause the controller to position the platform in a deposition area, e.g. adjacent the deposition means, before controlling the deposition means to deposit the further layer of metal ink. In another or further embodiment, the program instructions, when executed by the controller, cause the controller to control parts of the system such as the light source, and possibly the platform and/or mask, to provide the patterned light L onto the further layer of metal ink 20i to form a further subsection layer 22 of the micropillar array 20 in the metal ink 20i onto to the previously formed subsection layer 21. In a further embodiment, the program instructions, when executed by the controller, cause the controller to position the platform in a projection area of the patterned light before controlling the light source to project the patterned light in the projection area. In one embodiment, the system comprises a reciprocating platform configured to move between the deposition area and the projection area. In one embodiment, the program instructions, when executed by the controller, cause the controller to repeatedly execute the said steps of providing a further layer of metal ink and forming a further subsection layer until a micropillar array is formed comprising a plurality of subsection layers.

In one embodiment (not shown), the controller 30 is arranged and programmed for removing the mask 13 between the light source 14 and the carrier 11 after building a plurality of subsection layers 21,22,23,24 of the micropillar array 20; providing a further layer of metal ink 20i onto a last formed subsection layer 24 of the plurality of subsection layers 21,22,23,24; and providing unpatterned light L onto the further layer of metal ink 20i to form a continuous base section 29 of the micropillar array 20 in the metal ink 20i onto the last formed subsection layer 24, wherein the base section 29 forms a metal foil connecting the pillars 20p of the array 20.

In one embodiment, the system 100 further comprises etching means (e.g. reference 40 shown in FIG. 2B) for etching the non-sintered parts 201 of the metal ink 20i to provide an array of spatially separated pillars 20p with spacing therein between.

In one embodiment, the system 100 further comprises an electroplating means (e.g. reference 50 shown in FIG. 2C) configured to electroplate the sintered parts 20s of the metal ink 20i for smoothing an interface of the micropillars 20p.

In one embodiment, the controller 30 is programmed to move the platform 12 away relative to the mask 13 before irradiating each subsequent layer of metal ink 20i to fix a distance d between the mask 13 and the each subsequent layer of metal ink 20i to be irradiated. In one embodiment, the controller 30 is configured to keep a fixed distance d between the mask 13 and a top layer of the metal ink 20i to be patterned, e.g. wherein the distance d is less than 0.1 millimeter.

In one embodiment, the system 100 comprises a deposition section A1 comprising the deposition means 15; and an irradiation section A2 comprising the mask 13 and the light source 14. In the embodiment as shown if FIGS. 3A and 3B, the controller 30 is programmed to move the platform 12 back and forth between the deposition section A1 and the irradiation section A2 for each subsequent layer 21,22 of the micropillar array 20.

In one embodiment, the deposition means 15 comprises a coating head 15h comprising an outflow opening 15o, wherein the controller 30 is programmed to move the platform 12 with respect to the outflow opening 15o for depositing the layer metal ink 20i. In one embodiment, the deposition means comprises a slot die coating system for controlled application of a layer 20i. Also other deposition methods may be used. Alternatively, or in addition, the carrier 11 can be immersed in a vat comprising metal ink acting as the deposition means. For example, the carrier can be lowered into the vat for each subsequent layer.

In one embodiment, the light source is a high energy flash lamp 14 configured to provide a light flash L capable of sintering the metal ink 20i. In one embodiment, the light source is configured to provide a light flash L having a pulse length between 20 and 100 microseconds µs. In one embodiment, the light source is configured to provide a light flash L having a pulse energy density at the layer metal ink 20i between 0.5 and 5 Joule per centimeter $J/cm^2$. In one embodiment, the light source is configured to provide a light flash L having a pulse power density at the layer metal ink 20i between 10 and 100 kilowatts per centimeter $kW/cm^2$. In one embodiment, the light source is configured to provide a light flash L having a spectrum that lies predominantly in an infrared wavelength range>700 nm. While a flash lamp is a preferred light source for the present methods and systems, alternatively or in addition, a laser may be used.

Figure 4:
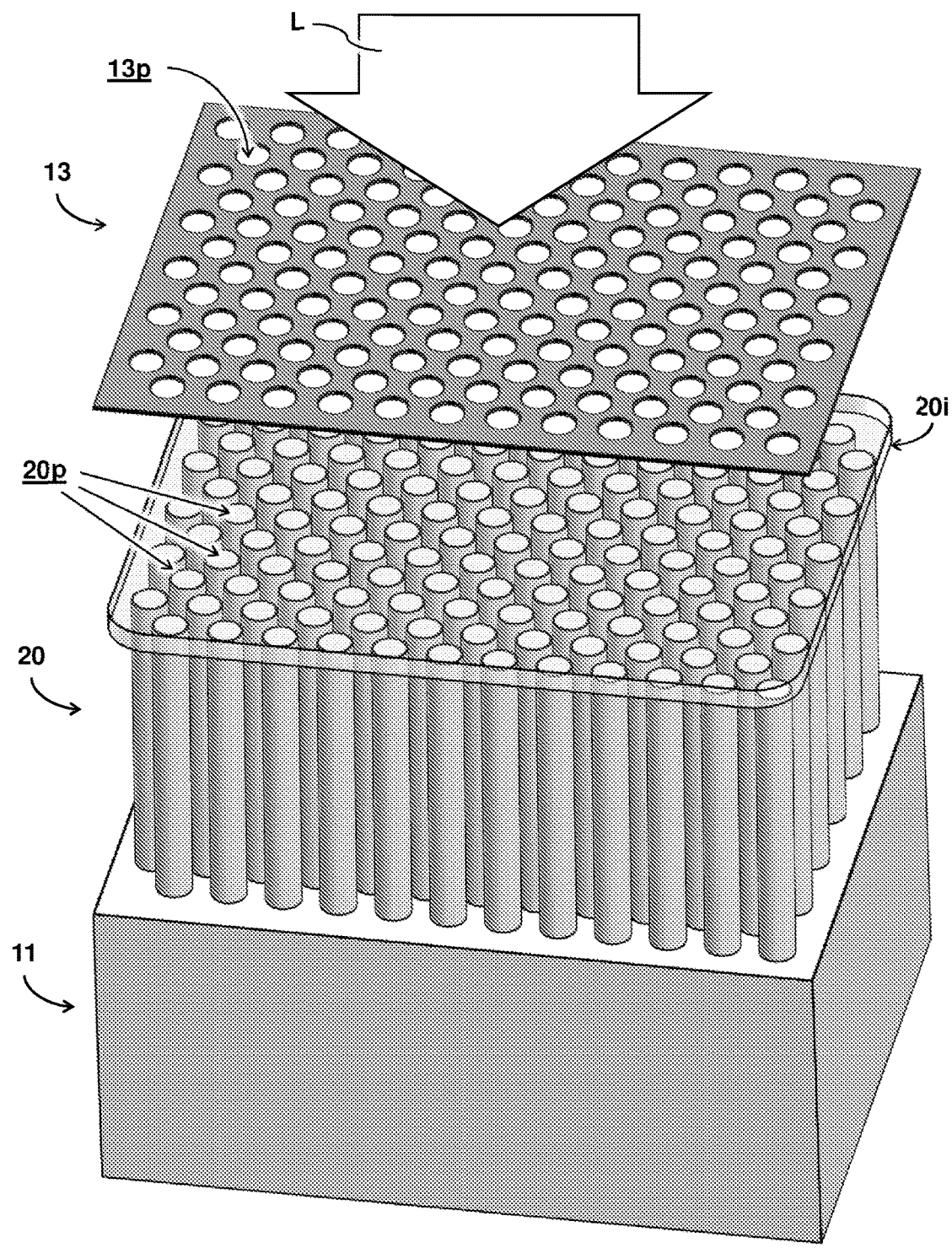
FIG. 4 schematically depicts an isometric view of an embodiment for manufacturing a micropillar array.

FIG. 4 schematically depicts an isometric view of an embodiment for manufacturing a micropillar array 20 onto a carrier 11. In the embodiment, light L is projected onto a top layer of metal ink 20i via a mask 13 comprising a mask pattern 13p. As shown, the mask pattern 13p corresponds to the cross-section pattern of the pillars 20p to be created. In one embodiment, the cross-section image projected by the mask comprises a plurality of cross-section shapes corresponding to micropillars 20p forming the array 20, wherein each of the cross-section shapes have a diameter in a range between 1 and 100 micrometers.

Figure 5:
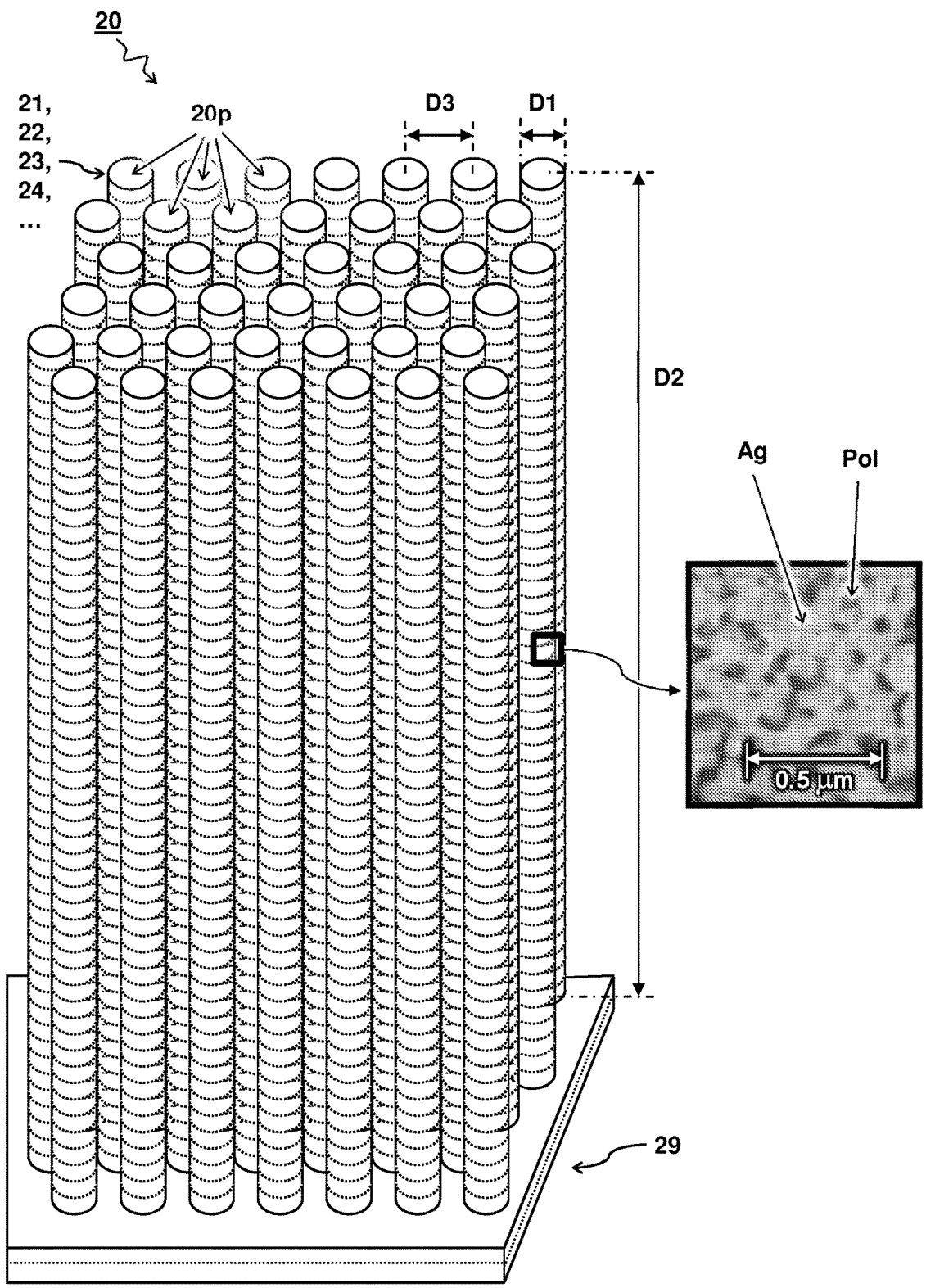
FIG. 5 schematically depict an embodiment of a micropillar array.

FIG. 5 schematically depict an embodiment of a micropillar array 20 comprising a plurality of micropillars 20p. The micropillars 20p are formed of a periodic layered structure of sintered metal ink comprising polymerized particles in a matrix of fused metal particles. In one embodiment, the micropillars 20p of the array 20 are periodically arranged with a pitch period D3 between 1.5 and 5 times a diameter D1 of the shapes. In one embodiment, the pillars 20p have a ratio D2:D1 between a height D2 of the pillars 20p and a diameter D1 of the pillars 20p, wherein the ratio D2:D1 is in a range between 20 and 200. In one embodiment, the pillars 20p comprise more than thirty subsection layers 21,22,23,24. Of course, while the pillars are shown here with a substantially round cross-section shape, the pillars can also have other cross-section shapes, e.g. square, rectangular, et cetera. The diameter D1 may generally refer e.g. to a widest cross section of the pillar transverse to its length D2.

In one embodiment, the plurality of micropillars 20p are disposed on a foil 29 connecting the micropillars 20p, wherein the foil 29 is formed of the same sintered metal ink as the micropillars 20p. In one embodiment, the micropillars 20p are enveloped by a smooth exterior metal layer obtainable by electroplating. In one embodiment, the metal ink comprises a suspension of metal particles in a liquid polymer matrix (Pol). In one embodiment, the metal ink comprises silver (Ag) particles. For example, the small inset shows a microscope image of fused silver particles (light color) with polymerized material therein between (dark color). In the embodiment, as shown, the fused metal particles (originating from the ink) still have a discernible particle size (diameter) of about 30-200 nm.

Figure 6A:
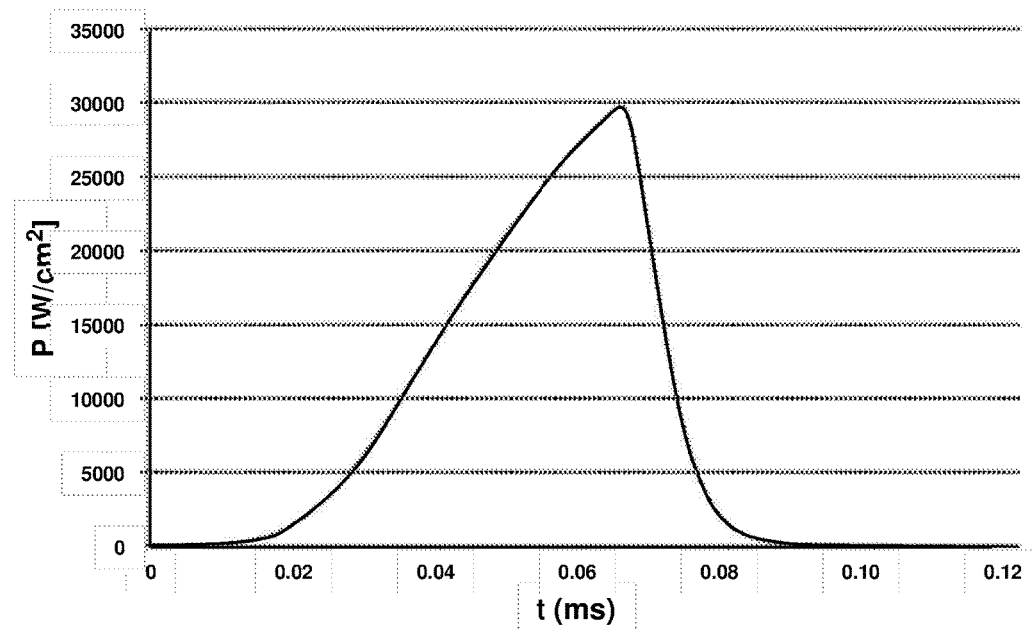
FIG. 6A depicts a measured pulse shape of a flash pulse.

FIG. 6A depicts a measured typical pulse shape of a flash pulse produced by high energy flash lamp, e.g. as used herein.

Figure 6B:
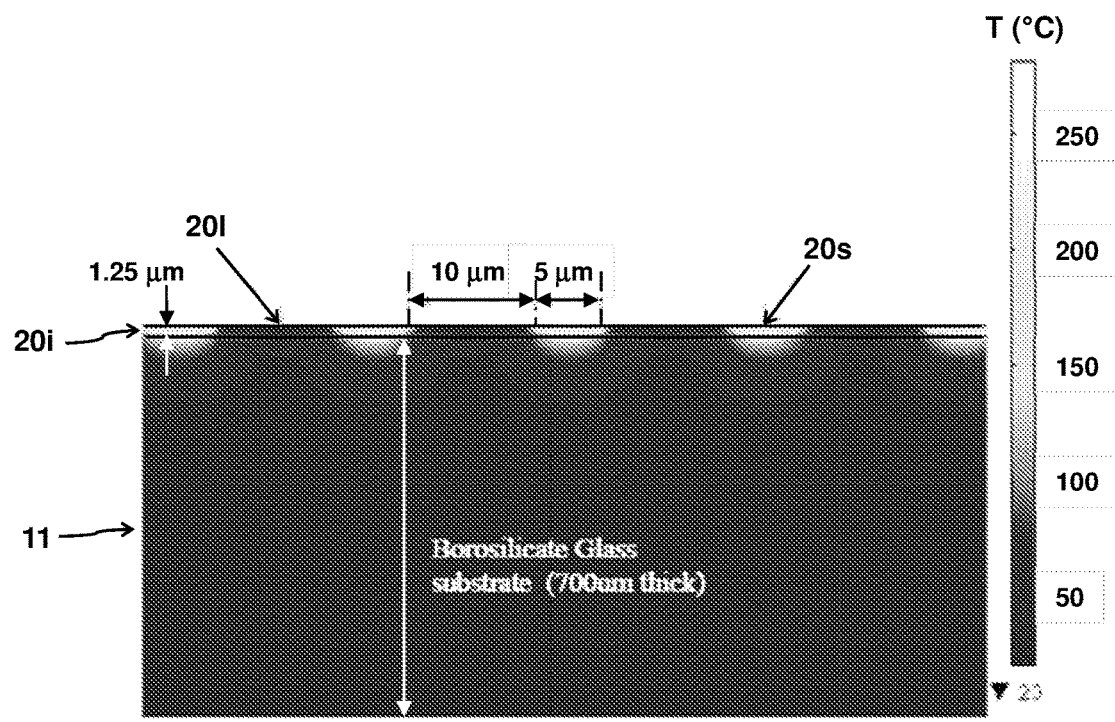
FIG. 6B depicts a simulation of a temperature profile of flash exposure.

FIG. 6B depicts a simulation of the temperature profile of flash exposure.

According to the simulation, a 65 µs pulse width is used, done through a mask having 5 microns pore opening with 15 microns pitch. The simulation is done for one layer of metal ink with 1.25 microns thickness. The ink properties used in the simulations are derived from experimental measurements and are listed as follows: Ag particle size: 50 nm, density: 7000 kg/m3, Heat capacity: 400 J/kg K, Thermal conductivity: 0.35 W/m K (this will increase rapidly when the when particles merge). The expected temperature in the layer as per the simulation is 250 C. At the same time, it was experimentally verified that with comparable conditions, a sintered layer with 3 times the bulk resistivity was obtained (cf. FIG. 5 inset).

Overall, the achievable spot diameter, spacing and cured layer thickness are found to be related to each other. The higher the thickness of the layer, the more power one needs to put into the layer for sintering. But higher power also means more heat-affected zone which affects the resolution of spot and the spacing. Dependent on the thermal conductivity of the substrate the required pulse length is determined. The glass substrate is preferably cooled by the table in order to achieve reproducible results since the glass will act as a thermal buffer layer which is a necessity for this process to work. Once a single layer is cured, the table or platform can be lowered and the subsequent layer can be made. By a cycle of coating-curing-lowering, the desired pillar heights can be attained. The final pillars structure, after releasing as a substrate, can be electroplated in order to get a smooth surface for depositing the battery layers.

The resolution and height of pillars formed in such a way are determined by many parameters including: metal ink properties (like thermal conductivity, particle size, polymer content etc.), substrate/carrier properties (like thermal conductivity, degradation-temperature, reflectivity etc.), flash unit parameters (peak power, emission spectrum, pulse width, mask resolution, mask-substrate distance etc.).

Design considerations may further include one or more of the following:

using a lower thermal conductivity carrier; otherwise the ink may not sinter due to heat loss.

the table below preferably acts as a good heat sink for the carrier (in case it heats up).

a gap between the mask and the coated ink (in a polymer or solvent matrix) is preferably less than a couple of tens of microns to achieve higher resolution structures the flash lamp preferably provides homogeneous fluence across the same area.

during washing-off or etching of the non-sintered ink finally, it should be taken care that the metal particles don't just have a neck-neck attachment, but are rather sintered closely (fused) to avoid dissolution of the sintered pillars.

For the purpose of clarity and a concise description, features are described herein as part of the same or separate embodiments, however, it will be appreciated that the scope of the invention may include embodiments having combinations of all or some of the features described. For example, while embodiments were shown for forming micropillar array using metal ink, also alternative ways may be envisaged by those skilled in the art having the benefit of the present disclosure for achieving a similar function and result. E.g. electrical, optical, and/or structural components may be combined or split up into one or more alternative components. The various elements of the embodiments as discussed and shown offer certain advantages, such as producing high aspect ratio micrometer sized structures. Of course, it is to be appreciated that any one of the above embodiments or processes may be combined with one or more other embodiments or processes to provide even further improvements in finding and matching designs and advantages. It is appreciated that this disclosure offers particular advantages for use in 3D solid state batteries, and in general can be applied for any application wherein high aspect ratio micrometer scaled structures can be used, e.g. as an optical absorber, photonic crystal, and/or catalyst surface. Embodiments wherein devices or systems are disclosed to be arranged and/or constructed for performing a specified method or function inherently disclose the method or function as such and/or in combination with other disclosed embodiments of methods or systems. Furthermore, embodiments of methods are considered to inherently disclose their implementation in respective hardware, where possible, in combination with other disclosed embodiments of methods or systems. Furthermore, methods that can be embodied as program instructions, e.g. on a non-transient computer-readable storage medium, are considered inherently disclosed as such embodiment.

Accordingly, the above-discussion is intended to be merely illustrative of the present systems and/or methods and should not be construed as limiting the appended claims to any particular embodiment or group of embodiments. The specification and drawings are thus to be regarded in an illustrative manner and are not intended to limit the scope of the appended claims. In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. The mere fact that certain measures are recited in mutually different claims does not indicate that a combination of these measures cannot be used to advantage. In particular, all working combinations of the claims are considered inherently disclosed.

The invention claimed is:

1. A system for manufacturing a micropillar array, the system comprising
   a platform configured to hold a carrier;
   a deposition means comprising a supply of metal ink, wherein the deposition means is configured to provide a layer of the metal ink onto the carrier;
   a light source configured to provide light capable of sintering the metal ink;
   a mask between the light source and the carrier, wherein the mask comprises a mask pattern configured to pattern the light according to a cross-section image of the micropillar array, wherein the light source and the mask are configured to have the patterned light impinge onto the layer of metal ink thereby causing a patterned sintering of the metal ink to form a subsection layer of the micropillar array in the metal ink;
   a controller arranged to control the deposition means, the light source, and the platform; and
   a computer-readable storage medium operatively linked to the controller and comprising program instructions that when executed by the controller, cause the controller to repeatedly execute the steps of
      controlling the deposition means to provide a further layer of metal ink onto a previously formed subsection layer of the micropillar array; and
      controlling the light source to provide the patterned light onto the further layer of metal ink to form a further subsection layer of the micropillar array in the metal ink onto to the previously formed subsection layer.

2. The system according to claim 1, wherein the controller is arranged and programmed for
   removing the mask between the light source and the carrier after building a plurality of subsection layers of the micropillar array;
   providing a further layer of metal ink onto a last formed subsection layer of the plurality of subsection layers; and
   providing unpatterned light onto the further layer of metal ink to form a continuous base section of the micropillar array in the metal ink onto the last formed subsection layer, wherein the base section forms a metal foil connecting the pillars of the array.

3. The system according to claim 1, wherein the system further comprises etching means for etching the non-sintered parts of the metal ink to provide an array of spatially separated pillars with spacing therein between.

4. The system according to claim 1, wherein the system further comprises an electroplating means configured to electroplate the sintered parts of the metal ink for smoothing an interface of the micropillars.

5. The system according to claim 1, wherein the carrier is transparent to the light of the light source.

6. The system according to claim 1, wherein the platform is configured to act as a heat sink in thermal contact with the carrier for drawing heat from the carrier to prevent sintering of the metal ink by heating of the carrier.

7. The system according to claim 1, wherein the light source is a high energy flash lamp configured to provide a light flash capable of sintering the metal ink.

8. The system according to claim 1, wherein the cross-section image comprises a plurality of cross-section shapes corresponding to micropillars forming the array, wherein each of the cross-section shapes have a diameter in a range between 1 and 100 micrometers.

9. A method for manufacturing a micropillar array, the method comprising
   providing a carrier with a layer of metal ink;
   providing a high energy light source and irradiating the layer of metal ink via a mask between the carrier and the light source, wherein the mask is configured to pass a cross-section illuminated image of the micropillar array onto the metal ink, thereby causing a patterned sintering of the metal ink to form a first subsection layer of the micropillar array in the layer of metal ink;
   applying a further layer of the metal ink on top of the first subsection layer of the micropillar array and irradiating the further layer via the same mask to form a second subsection layer of the micropillar array on top.

10. The method according to claim 9, further comprising
   removing the mask between the light source and the carrier after building a plurality of subsection layers of the micropillar array;
   providing a further layer of metal ink onto a last formed subsection layer of the plurality of subsection layers; and
   providing unpatterned light onto the further layer of metal ink to form a continuous base section of the micropillar array in the metal ink onto the last formed subsection layer, wherein the base section forms a metal foil connecting the pillars of the array.

11. The method according to claim 9, wherein the carrier comprises a sacrificial layer, wherein a first layer of metal ink is deposited onto the sacrificial layer of the carrier, wherein the micropillar array from the carrier is released after manufacturing by disintegrating the sacrificial layer.

12. The method according to claim 9, further comprising etching the non-sintered parts of the metal ink to provide an array of spatially separated pillars with spacing therein between.

13. The method according to any of claim 9, further comprising electroplating the micropillar array.

14. A micropillar array comprising a plurality of micropillars, wherein the micropillars are formed of a periodic layered structure of sintered metal ink comprising polymerized particles in a matrix of fused metal particles.

15. The micropillar array according to claim 14, wherein the plurality of micropillars are disposed on a foil connecting the micropillars, wherein the foil is formed of the same sintered metal ink as the micropillars.

16. The micropillar array according to claim 14, wherein the micropillars have a height to diameter ratio in a range between 20 and 200.

17. The micropillar array according to claim 16, wherein the micropillars are periodically arranged with a pitch period between 1.5 and 5 times a diameter of the micropillars.

18. The micropillar array according to claim 14, wherein the array is comprised in a battery.

\* \* \* \* \*